(12) United States Patent
Chen et al.

(10) Patent No.: US 11,792,939 B2
(45) Date of Patent: Oct. 17, 2023

(54) SUBSTRATE WITH BURIED COMPONENT AND MANUFACTURE METHOD THEREOF

(71) Applicant: UNIMICRON TECHNOLOGY CORP., Taoyuan (TW)

(72) Inventors: Yu-Shen Chen, Taoyuan (TW); Chung-Yu Lan, Taipei (TW)

(73) Assignee: UNIMICRON TECHNOLOGY CORP., Taoyuan (TW)

( * ) Notice: Subject to any disclaimer, the term of this patent is extended or adjusted under 35 U.S.C. 154(b) by 0 days.

(21) Appl. No.: 17/505,686

(22) Filed: Oct. 20, 2021

(65) Prior Publication Data
US 2023/0058180 A1  Feb. 23, 2023

(30) Foreign Application Priority Data
Aug. 23, 2021  (TW) .................. 110131144

(51) Int. Cl.
*H05K 1/02*  (2006.01)
*H05K 3/02*  (2006.01)
(Continued)

(52) U.S. Cl.
CPC ........... *H05K 1/186* (2013.01); *H05K 1/0218* (2013.01); *H05K 3/02* (2013.01); *H05K 3/328* (2013.01);
(Continued)

(58) Field of Classification Search
CPC ...... H05K 1/02; H05K 1/0203; H05K 1/0228; H05K 1/115; H05K 1/181;
(Continued)

(56) References Cited

U.S. PATENT DOCUMENTS

| 6,680,441 B2 * | 1/2004 | Kondo | ................... | H05K 1/186 |
| | | | | 428/209 |
| 9,443,743 B1 * | 9/2016 | Yeh | ...................... | H01L 23/5389 |

(Continued)

FOREIGN PATENT DOCUMENTS

TW  201106453 A  2/2011
TW  201309123 A  2/2013
(Continued)

OTHER PUBLICATIONS

Taiwan Patent Office "Office Action" dated Mar. 30, 2022, Taiwan.

*Primary Examiner* — Xiaoliang Chen
(74) *Attorney, Agent, or Firm* — WPAT, P.C

(57) ABSTRACT

A substrate is manufactured by drilling a chip containing groove in a composite inner layer circuit structure, having a component connecting end of a circuit layer protruding from a mounting side wall in the chip containing groove, mounting a chip component in the chip containing groove, and connecting the surface bonding pad to the component connecting end. The chip component in the present invention penetrates at least two circuit layers, and the surface bonding pad is bonded to the component connecting end of the circuit layer directly, reducing the occupied area of the chip component in each one of the circuit layers, and increasing the area for circuit disposing and the possible amount of chip components that may be mounted in the substrate.

3 Claims, 18 Drawing Sheets

(51) Int. Cl.
  *H01L 23/13* (2006.01)
  *H01L 23/485* (2006.01)
  *H05K 1/18* (2006.01)
  *H05K 3/32* (2006.01)
  *H05K 3/42* (2006.01)
  *H05K 3/00* (2006.01)

(52) U.S. Cl.
  CPC ............ *H05K 3/421* (2013.01); *H05K 3/0047* (2013.01); *H05K 2201/0723* (2013.01); *H05K 2201/10454* (2013.01); *H05K 2201/10636* (2013.01); *H05K 2203/0285* (2013.01); *H05K 2203/0292* (2013.01); *H05K 2203/0723* (2013.01)

(58) Field of Classification Search
  CPC ............ H05K 1/183–187; H05K 3/02; H05K 3/0047; H05K 3/328; H05K 3/421; H05K 2201/568; H05K 2201/02723; H05K 2201/064; H05K 2201/10454; H05K 2201/10515; H05K 2201/10636; H01L 21/561; H01L 21/565; H01L 21/4853; H01L 21/4857; H01L 21/6835; H01L 23/13; H01L 23/481; H01L 23/485; H01L 23/562; H01L 23/295; H01L 23/3121; H01L 23/3128; H01L 23/5389; H01L 23/49827
  USPC ....... 361/761, 311, 762, 737, 748, 752, 764; 174/257, 258, 260; 257/659, 690, 699, 257/701, 737, 773, 774
  See application file for complete search history.

(56) References Cited

U.S. PATENT DOCUMENTS

| | | | | |
|---|---|---|---|---|
| 9,661,759 | B2* | 5/2017 | Kim | H05K 3/107 |
| 9,999,131 | B2* | 6/2018 | Ko | H01L 24/17 |
| 10,353,158 | B2* | 7/2019 | Hiroshima | G02B 6/4238 |
| 2001/0006219 | A1* | 7/2001 | Kawai | H01L 25/0753 |
| | | | | 257/E25.032 |
| 2004/0014317 | A1* | 1/2004 | Sakamoto | H01L 23/49838 |
| | | | | 438/689 |
| 2005/0258447 | A1* | 11/2005 | Oi | H01L 23/5389 |
| | | | | 257/E23.178 |
| 2006/0118931 | A1* | 6/2006 | Ho | H01L 23/49827 |
| | | | | 257/E23.062 |
| 2006/0191711 | A1* | 8/2006 | Cho | H05K 1/185 |
| | | | | 361/764 |
| 2007/0030628 | A1* | 2/2007 | Yamamoto | H01G 4/232 |
| | | | | 361/311 |
| 2007/0076392 | A1* | 4/2007 | Urashima | H01L 24/81 |
| | | | | 257/E23.07 |
| 2007/0095471 | A1* | 5/2007 | Ito | H05K 1/185 |
| | | | | 257/E25.023 |
| 2008/0116565 | A1* | 5/2008 | Hsu | H01L 24/19 |
| | | | | 257/E21.597 |
| 2008/0128865 | A1* | 6/2008 | Chia | H01L 24/19 |
| | | | | 257/E21.505 |
| 2008/0185704 | A1* | 8/2008 | Hsu | H01L 24/19 |
| | | | | 257/690 |
| 2009/0097214 | A1* | 4/2009 | Lee | H01L 21/4857 |
| | | | | 361/752 |
| 2009/0316373 | A1* | 12/2009 | Kim | H01L 23/5389 |
| | | | | 361/764 |
| 2009/0321921 | A1* | 12/2009 | Hwang | H05K 3/007 |
| | | | | 361/764 |
| 2010/0013068 | A1* | 1/2010 | Huang | H05K 1/162 |
| | | | | 257/676 |
| 2010/0097770 | A1* | 4/2010 | Park | H01L 24/24 |
| | | | | 216/17 |
| 2010/0101849 | A1* | 4/2010 | Sunohara | H05K 1/185 |
| | | | | 29/832 |
| 2010/0103634 | A1* | 4/2010 | Funaya | H01L 25/0657 |
| | | | | 174/262 |
| 2010/0142115 | A1* | 6/2010 | Bae | H01G 4/30 |
| | | | | 156/252 |
| 2010/0181285 | A1* | 7/2010 | Tanaka | H05K 1/162 |
| | | | | 216/17 |
| 2010/0301473 | A1* | 12/2010 | Sasaoka | H01L 23/5389 |
| | | | | 257/737 |
| 2012/0081861 | A1* | 4/2012 | Shimada | H01L 24/16 |
| | | | | 361/737 |
| 2012/0153501 | A1* | 6/2012 | Murai | H01L 24/19 |
| | | | | 257/E23.174 |
| 2013/0098667 | A1* | 4/2013 | Ryu | H01L 24/19 |
| | | | | 174/257 |
| 2014/0029222 | A1* | 1/2014 | Saito | H05K 3/4632 |
| | | | | 361/762 |
| 2014/0048914 | A1* | 2/2014 | Lin | H01L 24/19 |
| | | | | 257/659 |
| 2014/0048916 | A1* | 2/2014 | Lin | H01L 24/82 |
| | | | | 257/659 |
| 2014/0048944 | A1* | 2/2014 | Lin | H01L 23/485 |
| | | | | 257/773 |
| 2014/0061877 | A1* | 3/2014 | Lin | H01L 24/19 |
| | | | | 257/659 |
| 2014/0239463 | A1* | 8/2014 | Chen | H01L 23/60 |
| | | | | 257/659 |
| 2015/0021074 | A1* | 1/2015 | Kim | H05K 3/4602 |
| | | | | 174/262 |
| 2015/0145145 | A1* | 5/2015 | Tsuyutani | H01L 21/561 |
| | | | | 438/126 |
| 2015/0195905 | A1* | 7/2015 | Kang | H01L 23/49894 |
| | | | | 427/79 |
| 2017/0154856 | A1* | 6/2017 | Standing | H01L 23/562 |
| 2018/0145033 | A1* | 5/2018 | Yi | H01L 23/5384 |
| 2018/0211939 | A1* | 7/2018 | Lin | H01L 24/24 |
| 2018/0226366 | A1* | 8/2018 | Kim | H01L 25/0655 |
| 2018/0374801 | A1* | 12/2018 | Jeng | H01L 21/0217 |
| 2019/0296102 | A1* | 9/2019 | Tain | H01L 28/40 |
| 2019/0306988 | A1* | 10/2019 | Grober | H01L 24/24 |
| 2020/0006346 | A1* | 1/2020 | Avci | H01L 28/91 |
| 2020/0006352 | A1* | 1/2020 | Avci | H01L 21/31144 |
| 2020/0091608 | A1* | 3/2020 | Alpman | H01Q 3/24 |
| 2020/0168592 | A1* | 5/2020 | Cheah | H01L 25/16 |
| 2020/0178006 | A1* | 6/2020 | Özden | H04R 25/554 |
| 2020/0411461 | A1* | 12/2020 | Lee | H01L 23/49827 |
| 2021/0098860 | A1* | 4/2021 | Kuo | H01L 23/5384 |
| 2022/0115350 | A1* | 4/2022 | Mun | H01L 21/6835 |
| 2022/0196725 | A1* | 6/2022 | Aal | G01R 31/2856 |
| 2022/0361315 | A1* | 11/2022 | Zhou | H05K 7/20936 |

FOREIGN PATENT DOCUMENTS

| | | |
|---|---|---|
| TW | 201611214 A | 3/2016 |
| TW | 202017126 A | 5/2020 |

* cited by examiner

SUBSTRATE WITH BURIED COMPONENT AND MANUFACTURE METHOD THEREOF

BACKGROUND OF THE INVENTION

1. Field of the Invention

The present invention relates to a substrate and a manufacture method thereof, and more particularly, a substrate with a buried component and manufacture method thereof.

2. Description of the Related Art

Referring to FIG. 8, the disposition direction of the chip component 90 of the substrate with a buried component 80 is parallel to the substrate 80 and the circuit layer structure 81. That is, the top surface 91 and the bottom surface 92 of the chip component 90 are toward the same direction with the top surface 82 and the bottom surface 83 of the circuit substrate 80. In addition, the chip component 90 is disposed in the circuit layer structure 81. In contrast to the traditional circuit layer structure disposing the chip component on the surface, the circuit substrate 80 disposing the chip component on the substrate with a buried component 80 in the inner circuit structure has the advantages of reducing the surface area of the substrate, the flexibility of disposing the circuit and the chip component, and the stability of being connected to the circuit.

In this way, the disposition for the chip component 90 occupies more areas of the circuit layer structure 81. Besides, the circuit substrate 80 needs to preserve the whole space for disposing the chip component 90, which limits the flexibility of the circuit substrate 80. Moreover, since the surface bonding pad 93 of the chip component 90 is disposed at the top surface 91 or the bottom surface 92 of the chip component 90 (FIG. 8 takes the surface bonding pad 93 at the top surface 91 as an example), the surface bonding pad 93 must be electrically connected to the circuit layer 812 of another circuit layer structure 81 via the conductive blind hole 813 of the circuit layer structure 81. As shown in FIG. 8, if two chip components 90, 90A disposed in the circuit substrate 80 need to be connected to each other, the surface bonding pad 93 of the chip component 90 is connected to the surface bonding pad 93A of another chip component 90A via the conductive blind hole 813A, the circuit layer 812B, and the conductive blind hole 813B. In this way, the path for connecting the two chip components 90, 90A increases, so that the noise gains, the power loses, space for connecting circuits expands, and the design flexibility for circuit layer structure with a buried chip component decreases.

SUMMARY OF THE INVENTION

In view of this, these and other objectives of the present invention will no doubt become obvious to those of ordinary skill in the art after reading the following detailed description of the preferred embodiment that is illustrated in the various figures and drawings.

To overcome the shortcomings, the present invention provides a substrate with a buried component and manufacture method thereof, and the substrate with the buried component includes a composite inner layer circuit structure and a chip component. The composite inner layer circuit structure includes a plurality of circuit layers. The plurality of circuit layers have at least one component connecting end. The chip component is disposed in the composite inner layer circuit structure and penetrates at least two circuit layers of the plurality of circuit layers. The chip component has at least one surface bonding pad at the bottom surface; wherein the at least one surface bonding pad of the chip component is connected to the at least one component connecting end of the plurality of circuit layers.

In an embodiment, the composite inner layer circuit structure has a chip containing groove. The chip containing groove is formed through at least two circuit layers of the plurality of circuit layers and has a mounting side wall; wherein the at least one component connecting end protrudes from the mounting side wall in the chip containing groove. The chip component is disposed in the chip containing groove. The bottom surface of the chip component faces to the mounting side wall in the chip containing groove. The surface bonding pad is connected to the at least one component connecting end of the at least two circuit layers.

In an embodiment, the substrate with a buried component further includes an adding layer circuit structure, stacked with the composite inner layer circuit structure and closing an opening of the chip containing groove.

In an embodiment, the chip containing groove has a bottom wall and a lateral wall. The mounting side wall is a part of the lateral wall. The substrate with a buried component further includes a metallic shield layer, covering the bottom wall of the chip containing groove and a part of the lateral wall excluding the mounting side wall, connected to the surface circuit structure, and electrically connected to a grounding terminal via the surface circuit structure.

The substrate with a buried component of the present invention embeds the chip component penetrating at least two circuit layers in the composite inner layer circuit structure so that the component connecting end of the circuit layer is directly bonded to the surface bonding pad of the chip component bottom surface. In other words, the chip component is not horizontally disposed in one single dielectric layer of the circuit structure, but perpendicularly connected to the circuit layer to be disposed in the composite inner layer circuit structure.

The manufacture method of a substrate with a buried component includes the following steps:
  providing a composite inner layer circuit structure, including a plurality of circuit layers;
  performing a drilling process to drill the composite inner layer circuit structure to form a chip containing groove; wherein the chip containing groove has a mounting side wall, and the mounting side wall penetrates at least two circuit layers of the plurality of circuit layers;
  performing a desmearing process for the chip containing groove; wherein the mounting side wall is protruded from at least one component connecting end of the plurality of circuit layers;
  disposing a chip component in the chip containing groove; wherein the chip component is disposed in the composite inner layer circuit structure to penetrate at least two circuit layers of the plurality of circuit layers; wherein the at least one component connecting end is aligned with a surface bonding pad of the chip component; and
  connecting the surface bonding pad of the chip component to the component 24 connecting end of the circuit layer.

In an embodiment, the manufacture method further includes: performing a circuit build-up layer process to dispose an adding layer circuit structure on the composite inner layer circuit structure to close an opening of the chip containing groove.

In an embodiment, after forming the chip containing groove, the manufacture method further includes the following steps:

performing an electroplating process to form a metallic shield layer on a bottom wall and a lateral wall of the chip containing groove;

performing a grinding process to remove the metallic shield layer covering a part of the lateral wall and to expose a part of the lateral wall and the component connecting end of the circuit layer; wherein the exposed lateral wall is the mounting side wall; and performing a desmearing process for the mounting side wall to allow at least one component connecting end of the circuit layer protruding from the mounting side wall.

In an embodiment, the circuit build-up layer process includes the following steps:

covering an adding dielectric layer on the composite inner layer circuit structure to close an opening of the chip containing groove;

performing a drilling process for the adding dielectric layer to form a trench communicating with an upper edge of the metallic shield layer;

disposing an adding circuit layer on the adding dielectric layer and in the trench; wherein the trench includes a shielding layer cover, and the shielding layer cover is a flat circuit; wherein the shielding layer cover further covers the opening of the chip containing groove in a perpendicular projection direction of the composite inner layer circuit structure, and the shielding layer cover is connected to the metallic shield layer upper edge in the trench; wherein the metallic shield layer is electrically connected to a grounding terminal via the adding circuit layer.

In an embodiment, the surface bonding pad of the chip component is bonded to the component connecting end of the circuit layer by a heat diffusion welding process or an ultrasonic welding process.

The present invention provides another manufacture method of a substrate with a buried component, including the following steps:

providing a first composite inner layer circuit structure; wherein the first composite inner layer circuit structure includes a plurality of first circuit layers, and has a first side; wherein at least one component connecting end of the plurality of first circuit layers protrudes from the first side;

providing a chip component; wherein the chip component has a top surface and a bottom surface opposite to the top surface, and has at least one surface bonding pad at the bottom surface of the chip component;

facing the bottom surface of the chip component to the first side of the first composite inner layer circuit structure;

connecting the at least one surface bonding pad to at least one component connecting end of the first composite inner layer circuit structure;

providing a second composite inner layer circuit structure; wherein the second composite inner layer circuit structure has a second side, and the second side is bonded with a second surface of the chip component;

performing a circuit build-up layer process to dispose two surface circuit structures at the first composite inner layer circuit structure and the second composite inner layer circuit structure to fix the first composite inner layer circuit structure, the chip component, and the second composite inner layer circuit structure between the two surface circuit structures.

In an embodiment, the first composite inner layer circuit structure has a first top surface and a first bottom surface opposite to the first top surface. The second composite inner layer circuit structure has a second top surface and a second bottom surface opposite to the second top surface; the first top surface parallels and faces in the same direction with the second top surface, and the first bottom surface parallels and faces in the same direction with the second bottom surface. The circuit build-up layer process includes the following steps:

covering a first build-up dielectric layer on the first top surface of the first composite inner layer circuit structure and the second top surface of the second composite inner layer circuit structure;

covering a second build-up dielectric layer on the first bottom surface of the first composite inner layer circuit structure and the second bottom surface of the second composite inner layer circuit structure;

disposing a first build-up circuit layer on the first build-up dielectric layer; and disposing a second build-up circuit layer on the second build-up dielectric layer.

The substrate with a buried component of the present invention disposes a chip containing groove formed through at least two circuit layers in the composite inner layer circuit structure so that the component connecting end of the circuit layer protrudes from the mounting side wall of the chip containing groove. When the chip component is disposed in the chip containing groove, the bottom surface is toward the mounting side wall so that the surface bonding pad is connected to the component connecting end of the circuit layer. In other words, the chip component is not horizontally disposed in the dielectric layer of one single circuit structure, but vertically connected to the dielectric layer and the circuit layer, and disposed in the composite inner layer circuit structure. The surface bonding pad at the bottom surface of the chip component is connected to at least one component connecting end protruding from the chip containing groove.

In this way, the less space on one of the circuit layers the chip component occupies, the more areas on the circuits layer the circuits can be disposed. In contrast, since the single chip component disposed needs less area disposed on the circuit layer, more chip components can be disposed in the same size of the circuit substrate to raise the density of the chip component disposed in the substrate with a buried component. Simultaneously, when a plurality of chip components need to be connected to each other, the plurality of chip components are directly connected to the circuit in the circuit layer since the chip component can be connected to the circuit layer without being connected to the conductive blind hole. Furthermore, two chip components can be connected to each other via the circuit layer without being connected to the conductive blind hole, the circuit, and the conductive blind hole. Hence, the connection path between two chip components is shorter and the signal loss and the noise are reduced.

DETAILED DESCRIPTION OF THE INVENTION

Figure 1:
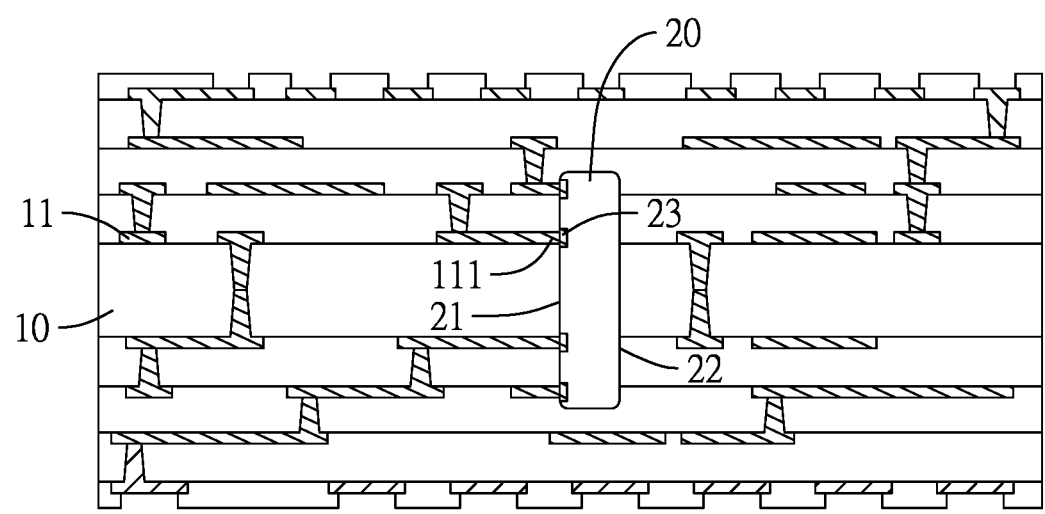
FIG. 1 is a side view profile diagram of a substrate with a buried component of the present invention.

Refer to FIG. 1. The substrate with a buried component of the present invention includes a composite inner layer circuit structure 10 and a chip component 20. The composite inner layer circuit structure 10 includes a plurality of circuit layers 11, wherein the plurality of circuit layers 11 have at least one component connecting end 111. The chip component 20 is disposed in the composite inner layer circuit structure 10 and penetrates at least two circuit layers 11 of the plurality of circuit layers 11. The chip component 20 has a top surface 22, a bottom surface 21, and at least one surface bonding pad 23 at the bottom surface 21. The at least one surface bonding pad 23 of the chip component 20 is directly bonded with the at least one component connecting end 111.

The substrate with a buried component of the present invention can be manufactured by at least two methods as below.

Figure 2A:
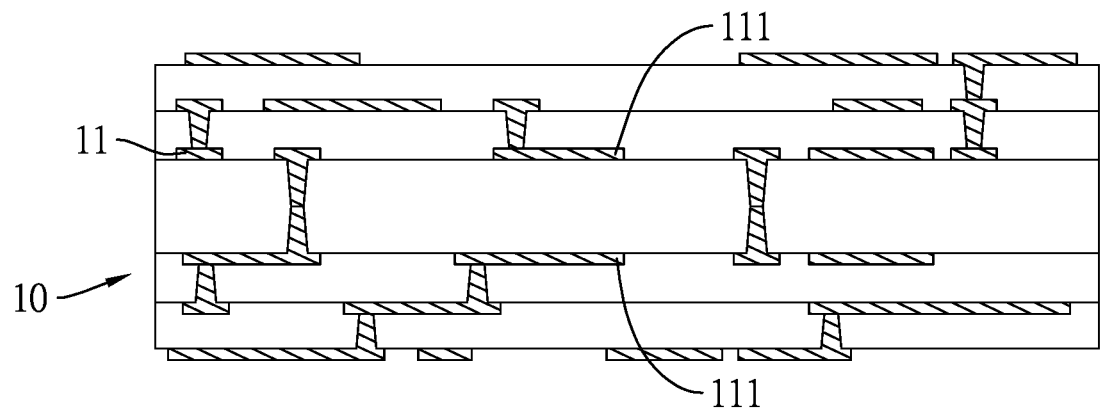
FIG. 2A to FIG. 2H are the profile diagrams of the manufacture method for the substrate with a buried component in the first embodiment of the present invention.
Figure 2B:
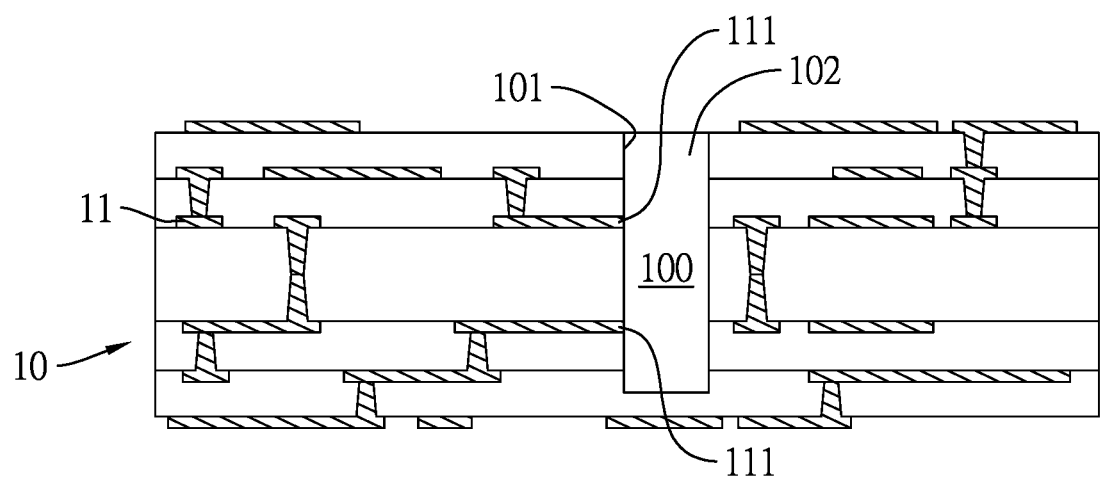
Figure 2C:
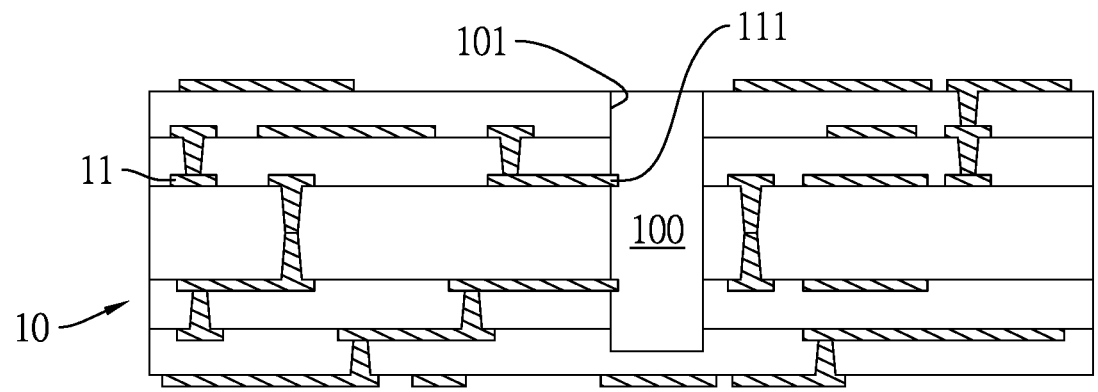
Figure 2D:
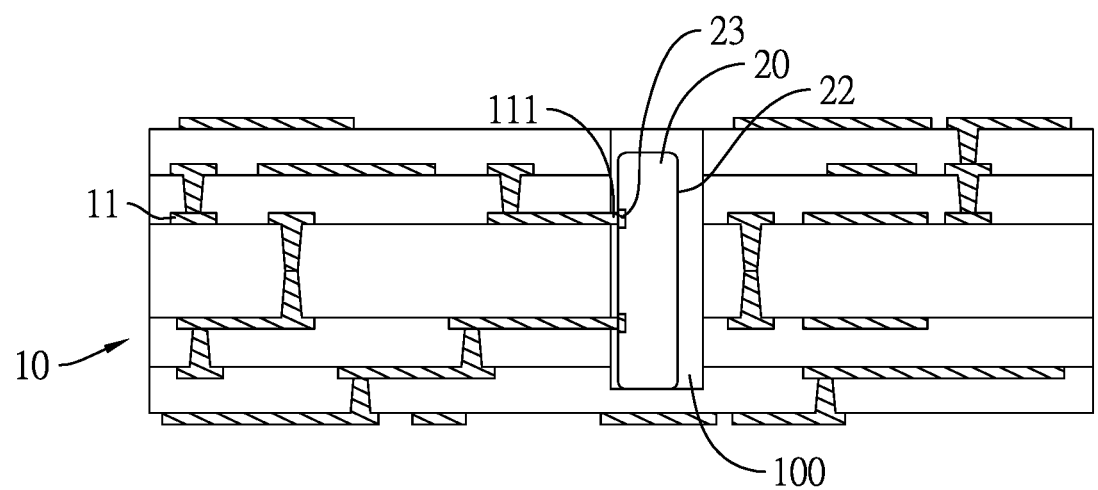
Figure 2E:
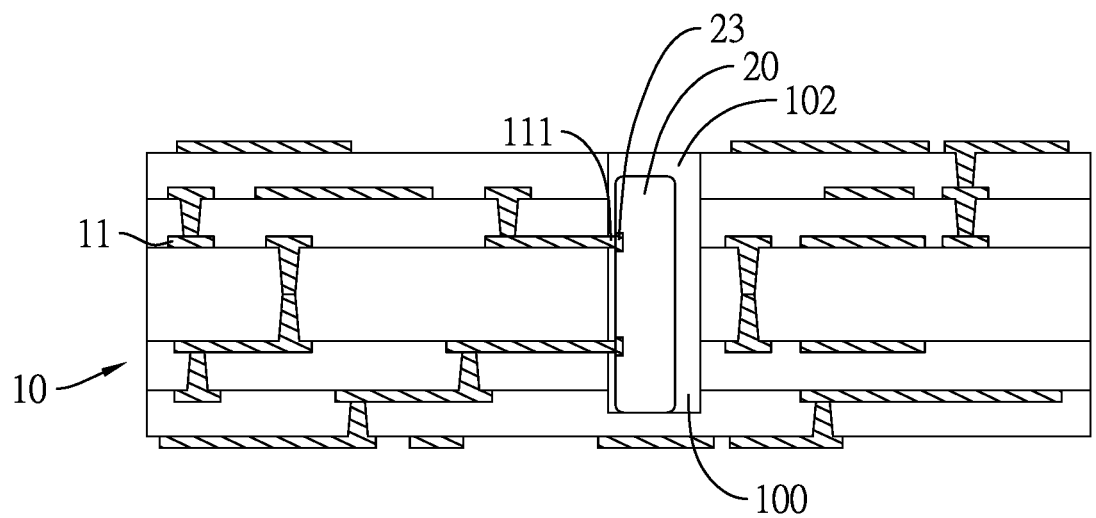

Refer to FIG. 2A to FIG. 2E. The first embodiment of the method for manufacturing the substrate with a buried component of the present invention includes the following steps:
- as shown in FIG. 2A, providing a composite inner layer circuit structure 10, including a plurality of circuit layers 11; wherein the plurality of circuit layers 11 has at least one component connecting end 111;
- as shown in FIG. 2B, performing a drilling process for the composite inner layer circuit structure 10 to form a chip containing groove 100; wherein the chip containing groove 100 is formed through at least two circuit layers 11 of the plurality of circuit layers 11 and the chip containing groove 100 has a mounting side wall 101;
- as shown in FIG. 2C, performing a desmearing process for the chip containing groove 100; wherein the at least one component connecting end 111 protrudes from the mounting side wall 101;
- as shown in FIG. 2D, disposing a chip component 20 in the chip containing groove 100; wherein the chip component 20 disposed in the composite inner layer circuit structure 10 penetrates at least two circuit layers 11 of the plurality of circuit layers 11, and at least one surface bonding pad 23 of the chip component 20 aligns with the at least one component connecting end 111; and
- as shown in FIG. 2E, connecting the surface bonding pad 23 of the chip component 20 to the component connecting end 111 of the circuit layer 11.

In the embodiment, the method first provides the composite inner layer circuit structure 10 having a plurality of circuit layers 11. The method drills the surface of the composite inner layer circuit structure 10 to form a chip containing groove 100 for embedding the chip component 20 so that the component connecting ends 111 of the plurality of circuit layers 11 are exposed from the chip containing groove 100. It should be noted that the component connecting end 111 of the at least two circuit layers 11 and the space of the chip containing groove 100 are preserved and predetermined according to the circuit layer 11 so that the component connecting end 111 is disposed at the edge of the predetermined space of the chip containing groove 100. In this way, when the composite inner layer circuit structure 10 is processed for the drilling process, the component connecting end 111 of the circuit layer 11 is extremely close to or is exactly exposed from the mounting side wall 101 of the chip containing groove 100. FIG. 2B is an embodiment that the component connecting end 111 is exactly exposed from the chip containing groove 100. After the drilling process, the method desmears the chip containing groove 100 to remove the dielectric residue in the chip containing groove 100. The process erodes the inner wall of the chip containing groove 100 so that the component connecting end 111 extremely close to or exposed from the surface of the mounting side wall 101 protrudes from the mounting side wall 101 to be connected to the bonding pad 23 of the chip component 20. In the preferable embodiment, the surface bonding pad 23 of the chip component 20 and the component connecting end 111 of the circuit layer 11 are directly bonded by the method of heat diffusion welding or the method of ultrasonic welding.

In the embodiment, the composite inner layer circuit structure 10 has the chip containing groove 100. The chip containing groove 100 is formed through at least two circuit layers 11 and has a mounting side wall 101. The component connecting end 111 of the plurality of circuit layers 11 protrudes from the mounting side wall 101 of the chip containing groove 100. The chip component 20 is disposed in the chip containing groove 100 and penetrates the at least two circuit layers 11. The bottom surface 21 of the chip component 20 faces the mounting side wall 101 of the chip containing groove 100. The surface bonding pad 23 is directly bonded to the component connecting end 111 of the circuit layer 11.

Figure 2F:
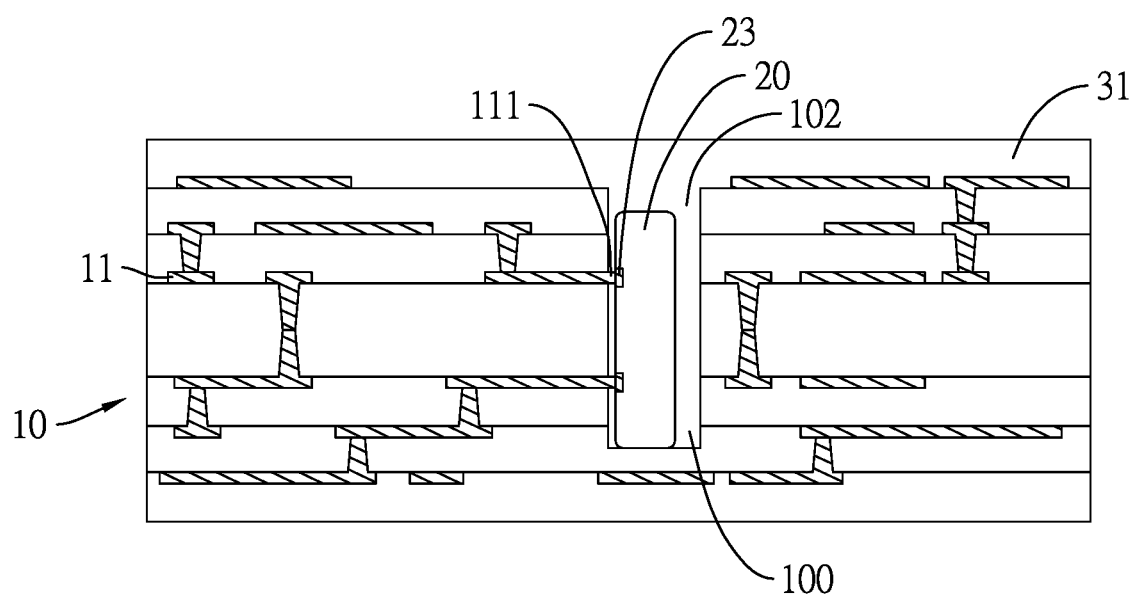
Figure 2G:
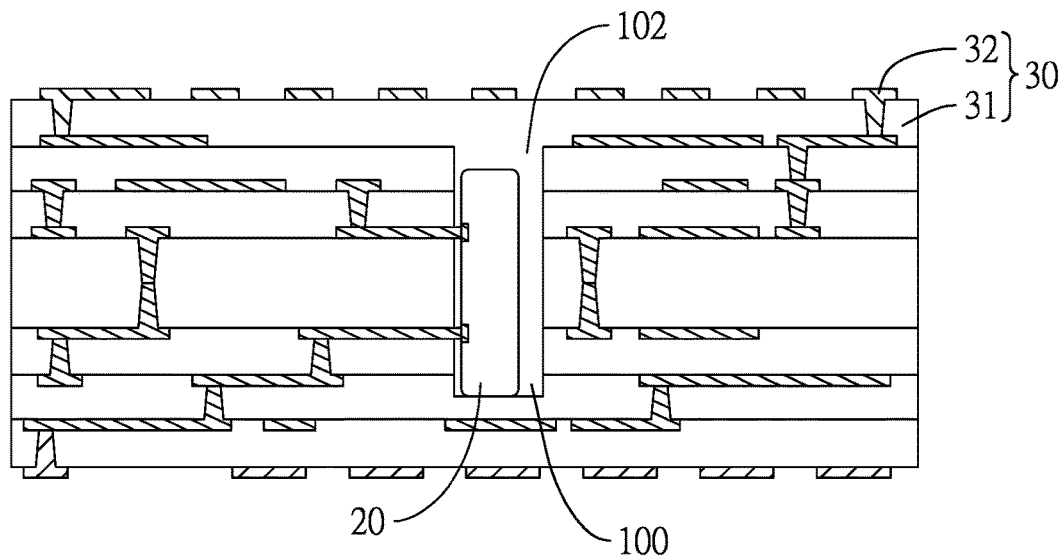
Figure 2H:
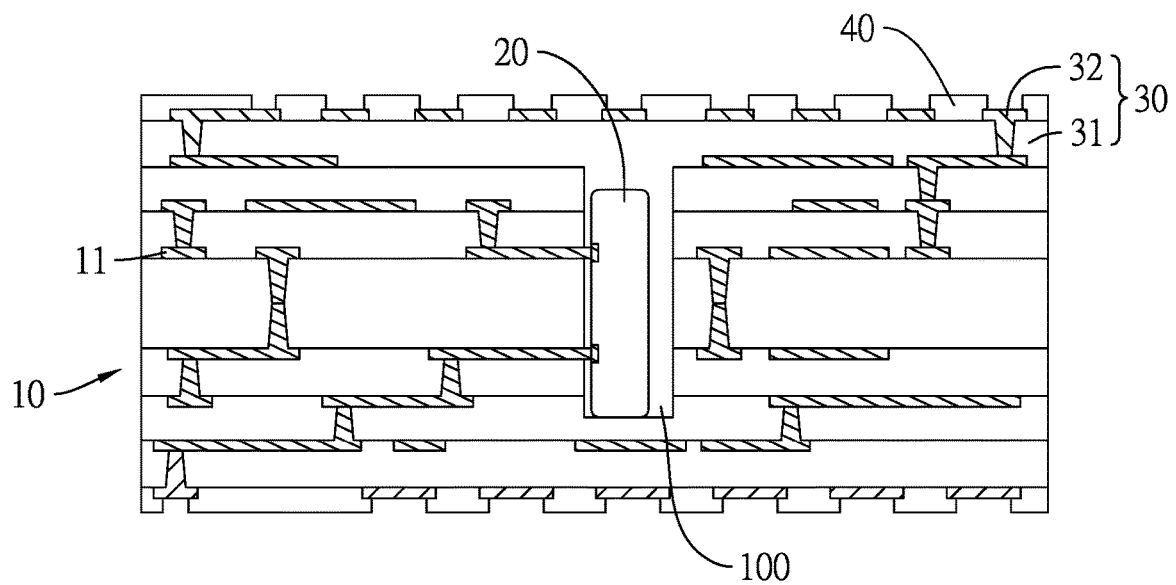

As shown in FIG. 2F to FIG. 2H. In the first embodiment, after the surface bonding pad 23 of the chip component 20 is bonded to the component connecting end 111 of the circuit layer 11, the method further includes the following steps:
- performing a circuit build-up layer process to dispose an adding layer circuit structure 30 on the composite inner layer circuit structure 10; and
- closing an opening 102 of the chip containing groove 100 to complete the substrate with a buried component.

The adding layer circuit structure 30 includes at least one adding dielectric layer 31 and at least one adding circuit layer 32. The embodiment takes one single adding dielectric layer 31 and one single adding circuit layer 32 for an example, but is not limited thereto in the present invention. The process for disposing the adding layer circuit structure 30 includes the following steps:
- as shown in FIG. 2F, pressing an adding dielectric layer 31 on the composite inner layer circuit structure 10; wherein the adding dielectric layer 31 closes the opening 102 of the chip containing groove 100; wherein the opening 102 is formed at the drilling process for the composite inner layer circuit structure 10 to form a chip containing groove 100; preferably, when the method performs the step for pressing the adding dielectric layer 31, the material of the adding dielectric layer 31 is squeezed into the chip containing groove 100 and fills the chip containing groove 100;
- as shown in FIG. 2G, disposing an adding circuit layer 32 on the adding dielectric layer 31; and as shown in FIG. 2H, disposing a solder mask layer 40 on the adding circuit layer 32; wherein the solder mask layer 40 has at least one solder mask opening to expose a part of the adding circuit layer 32.

When the method performs the step for pressing the adding dielectric layer 31 on the composite inner layer circuit structure 10, the material of the adding dielectric layer 31 is squeezed from the opening 102 at the surface of the composite inner layer circuit structure 10 to the chip containing groove 100 at the same time so that the material of the adding dielectric layer 31 is filled into the chip containing groove 100. In another embodiment, the method can perform an adhesive-filling process for the chip component 20 disposed in the chip containing groove 100 before pressing the adding dielectric layer 31 to fill the adhesive in the chip containing groove 100.

After pressing the adding dielectric layer 31, the method further disposes the adding circuit layer 32 and the solder mask layer 40 on the adding dielectric layer 31. The adding circuit layer 32 and the solder mask layer 40 can be disposed by the processes, which include drilling, exposure developing, electroplating, etching, and pressing the solder mask layer 40, and the details are omitted herein.

Figure 3A:
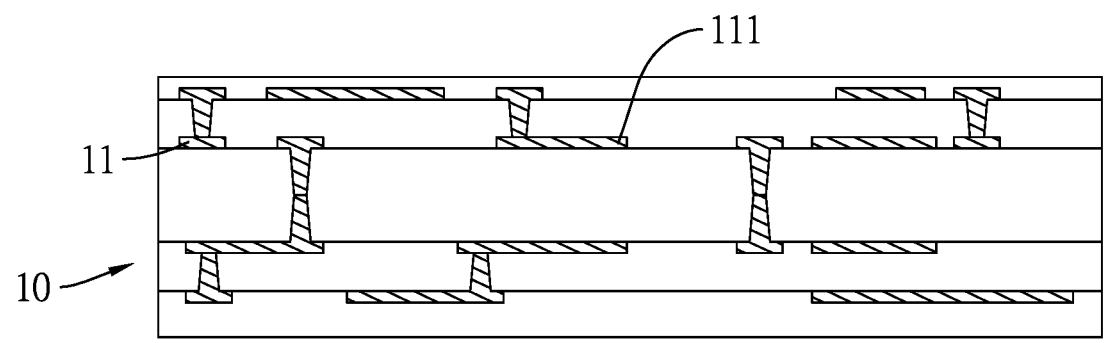
FIG. 3A to FIG. 3L are the profile diagrams of the manufacture method for the substrate with a buried component in the second embodiment of the present invention.
Figure 3B:
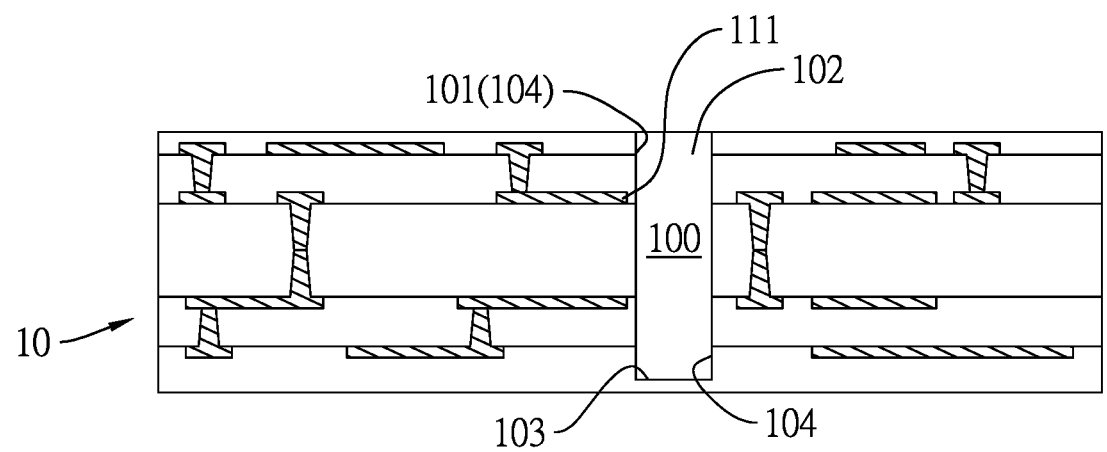
Figure 3C:
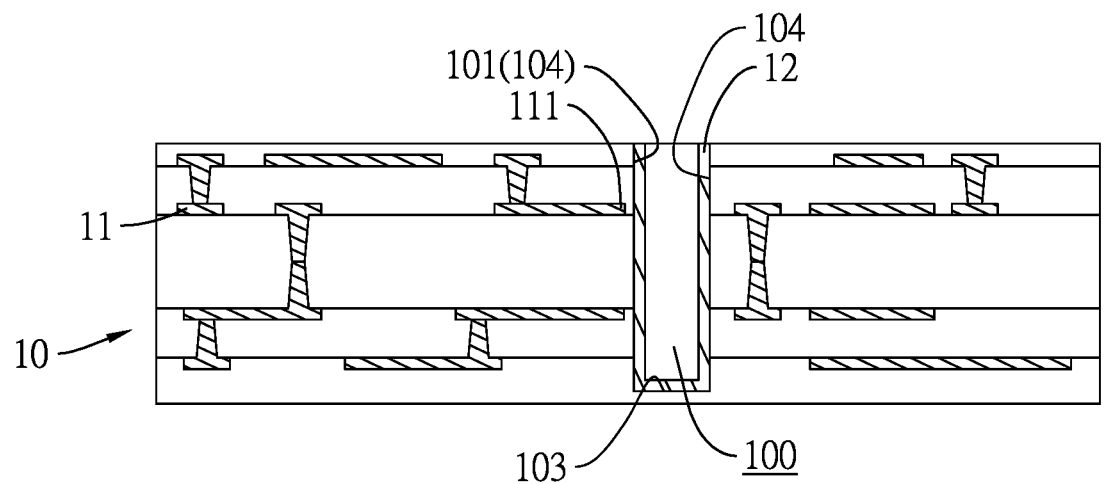
Figure 3D:
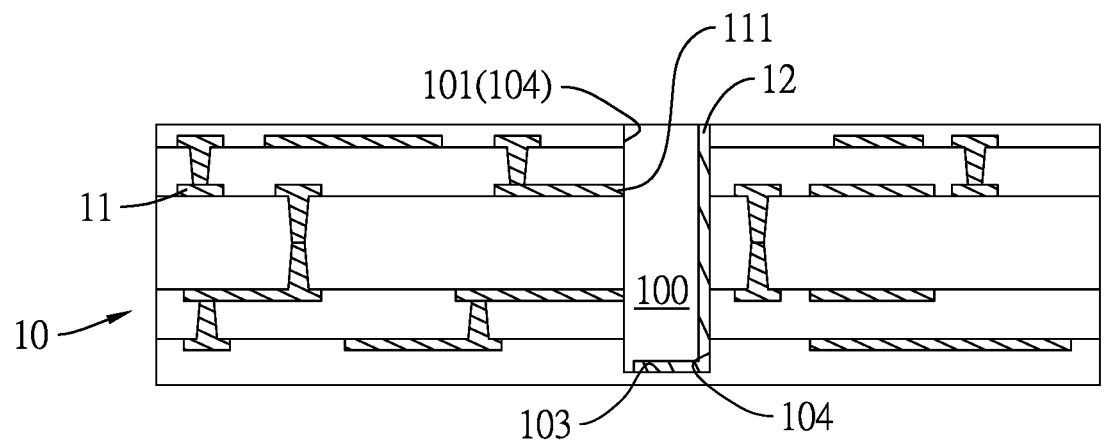
Figure 3E:
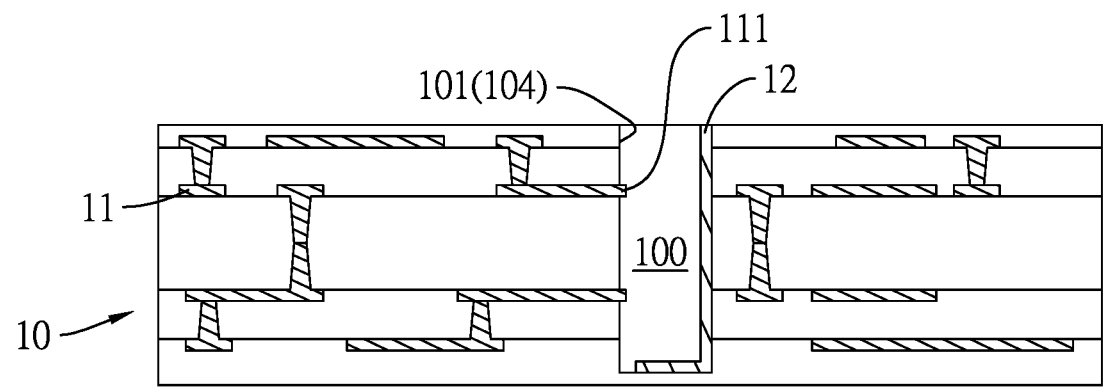

As shown in FIG. 3A to FIG. 3E. In a second embodiment, preferably, the chip containing groove 100 further includes a metallic shield layer 12. In details, the chip containing groove 100 has a bottom wall 103 and a lateral wall 104. The mounting side wall 101 mentioned above is a part of the lateral wall 104. The metallic shield layer 12 covers the bottom wall 103 of the chip containing groove 100 and a part of the lateral wall 104 excluding the mounting side wall 101. The method for manufacturing the substrate with a buried component with the metallic shield layer 12 includes the following steps:

as shown in FIG. 3A, providing a composite inner layer circuit structure 10; wherein the composite inner layer circuit structure 10 includes a plurality of circuit layers 11;

as shown in FIG. 3B, performing a drilling process for the composite inner layer circuit structure 10 to form a chip containing groove 100; wherein the chip containing groove 100 is formed through at least two circuit layers 11 of the plurality of circuit layers 11; wherein the bottom wall 103 and the lateral wall 104 are disposed in the chip containing groove 100 and a part of the lateral wall 104 is the mounting side wall 101;

as shown in FIG. 3C, when the method forms the chip containing groove 100, the method further performs an electroplating process for the chip containing groove 100 to form the metallic shield layer 12 on the bottom wall 103 and the lateral wall 104 of the chip containing groove 100;

after that, as shown in FIG. 3D, performing a polish process for a part of the lateral wall 104 belonging to the mounting side wall 101 in the chip containing groove 100 to remove the metallic shield layer 12; wherein the metallic shield layer 12 covers the part of the lateral wall 104 to expose a part of the lateral wall 104, and to expose the component connecting end 111 of the circuit layer 11; wherein, the exposed lateral wall 104 is the mounting side wall 101; and as shown in FIG. 3E, performing a desmearing process for the mounting side wall 101; wherein at least one component connecting end 111 of the circuit layer 11 protrudes from the mounting side wall 101.

Figure 3F:
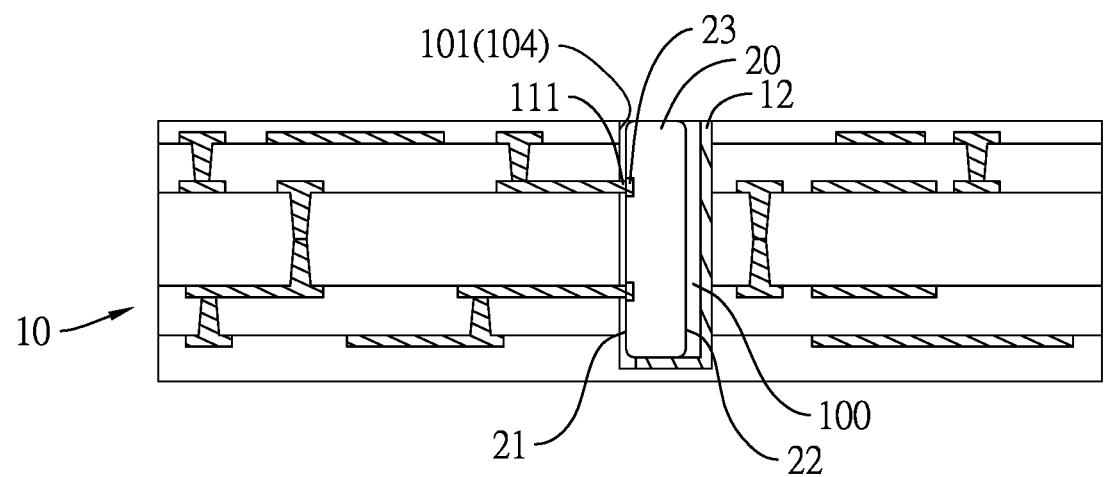
Figure 3G:
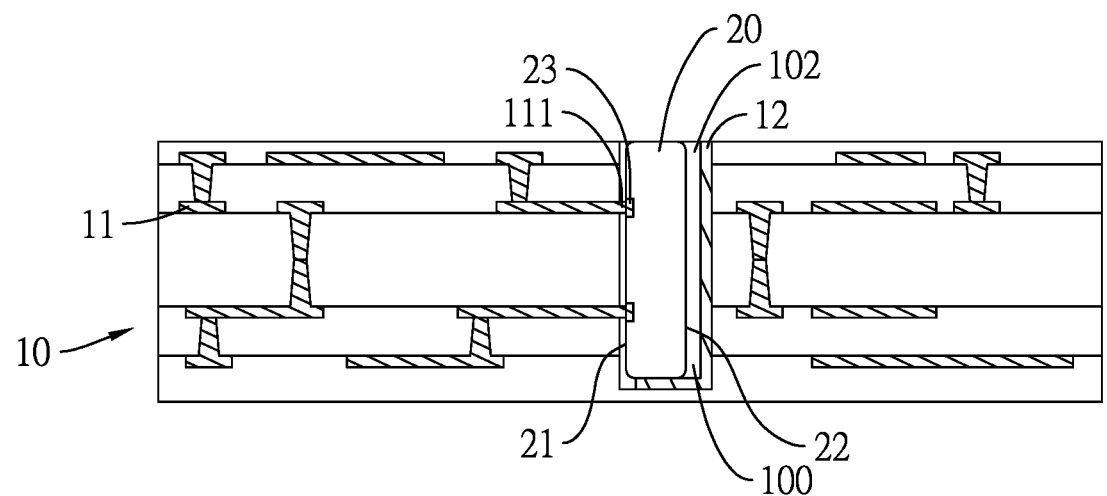

In this way, the metallic shield layer 12 disposed in the chip containing groove 100 is completed. Referring to FIG. 3F and FIG. 3G, after disposing the metallic shield layer 12, the chip component 20 is disposed in the chip containing groove 100. The details for disposing the chip component 20 are similar to the first embodiment and omitted herein.

Figure 3H:
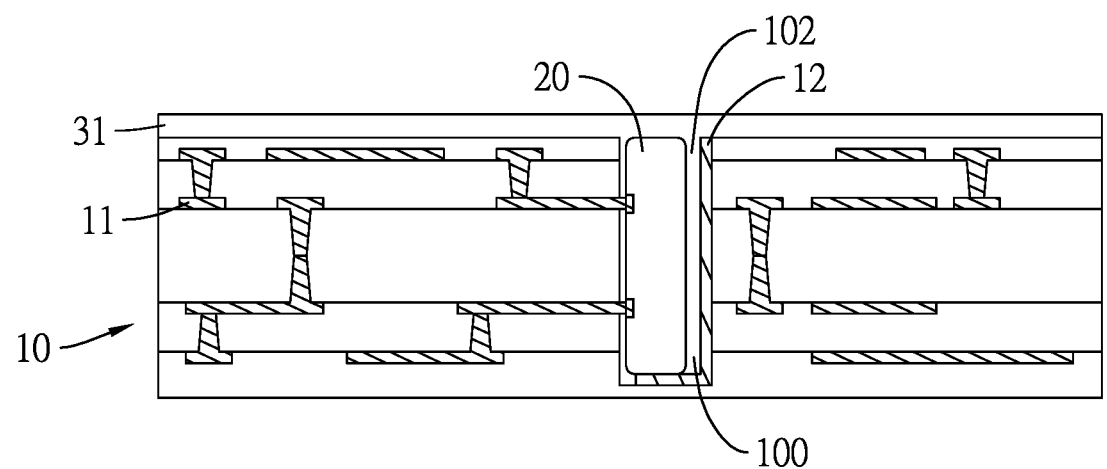
Figure 3I:
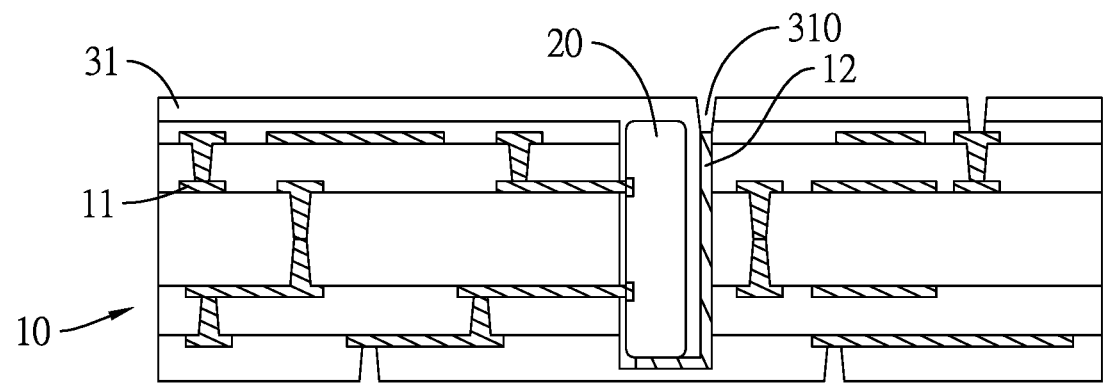
Figure 3J:
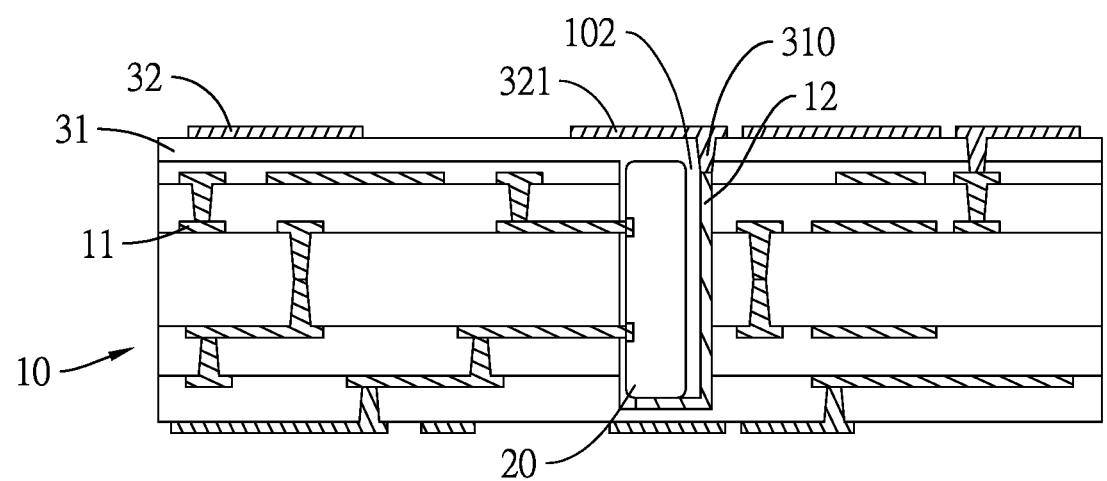
Figure 3K:
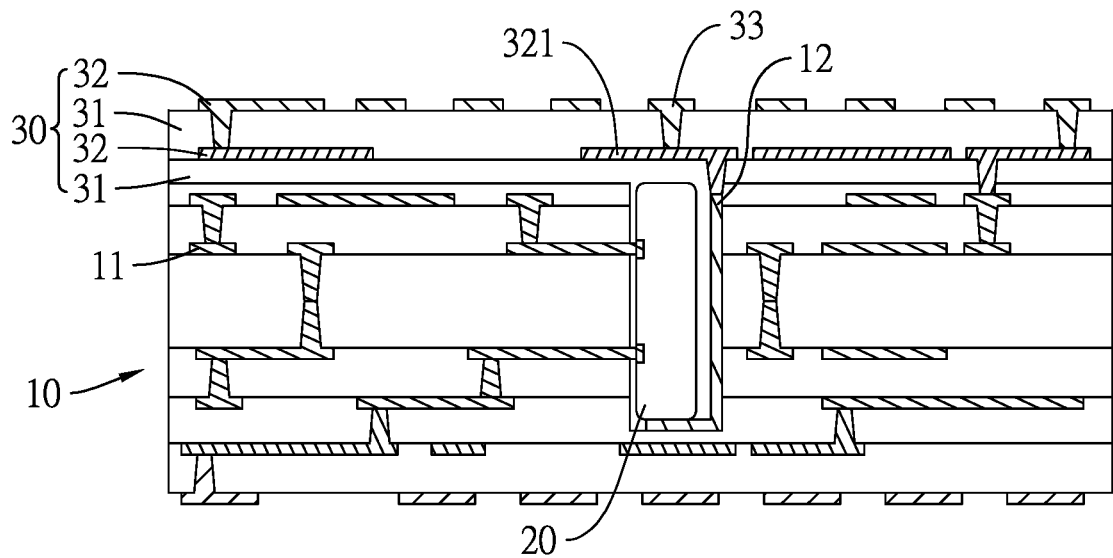
Figure 3L:
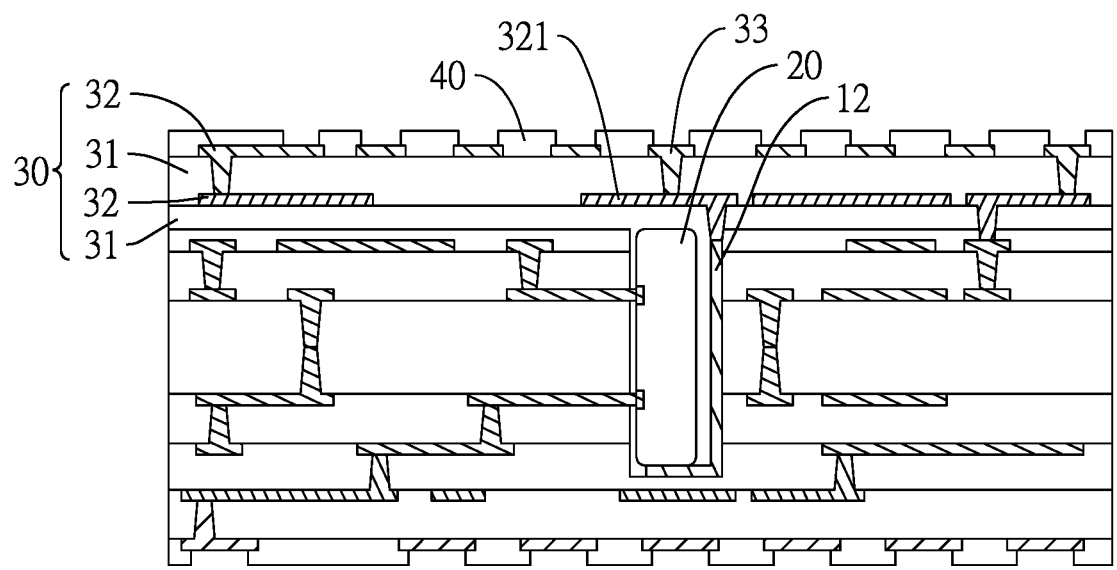

As shown in FIG. 3H to FIG. 3J. In the embodiment, similarly, after disposing the chip component 20, the adding layer circuit structure 30 will be disposed on the composite inner layer circuit structure 10. It should be noted, in the embodiment, the adding layer circuit structure 30 further includes a shielding layer cover 321. The metallic shield layer 12 covers the surface in the chip containing groove 100 excluding the mounting side wall 101. The shielding layer cover 321 is a flat circuit, corresponding to the opening 102 disposed in the chip containing groove 100, and covering above the chip component 20. The steps for the adding layer circuit structure 30 are described as below:

as shown in FIG. 3H, covering an adding dielectric layer 31 on the composite inner layer circuit structure 10; wherein the adding dielectric layer 31 closes the opening 102 of the chip containing groove 100;

as shown in FIG. 3I, performing a drilling process for the adding dielectric layer 31 to form a trench 310; wherein the trench 310 communicates with an upper edge of the metallic shield layer 12;

as shown in FIG. 3J, disposing an adding circuit layer 32 on the adding dielectric layer 31 and in the trench 310, including a shielding layer cover 321, which is a flat circuit; wherein the projection of the shielding layer cover 321 of the adding circuit layer 32 in a perpendicular direction of the composite inner layer circuit structure 10 covers the opening 102 of the chip containing groove 100, and the shielding layer cover 321 connects to the upper edge of the metallic shield layer 12 in the trench 310;

As shown in FIG. 3K and FIG. 3L, the adding layer circuit structure 30 can include multiple adding dielectric layers 31 and multiple adding circuit layers 32. The grounding terminal 33 can be disposed in the outermost adding circuit layer 32 so that the metallic shield layer 12 and the shielding layer cover 321 are electrically connected to the grounding terminal 33. Ultimately, the solder mask layer 40 is disposed on the outermost adding circuit layer 32 to complete the substrate with a buried component. The metallic shield layer 12 with the shielding layer cover 321 are connected to the grounding terminal 33, the metallic shield layer 12 and the shielding layer cover 321 to form a metallic shielding mask with an electromagnetic shielding function for the chip component 20 disposed in chip containing groove 100.

Figure 4:
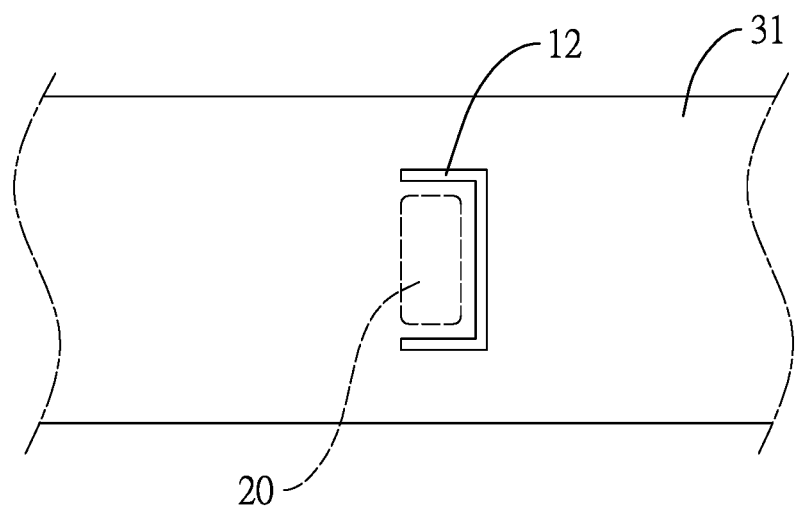
FIG. 4 is a partial top view for one step of the manufacture method for the substrate with a buried component in the second embodiment of the present invention.

Preferably, refer to FIG. 4. FIG. 4 is the plan schematic view for the adding dielectric layer 31 after forming the trench 310. Since the metallic shield layer 12 is disposed according to the position of the lateral wall 104 disposed in the chip containing groove 100, failing to cover the mounting side wall 101, an upper edge of the metallic shield layer 12 is in the "n" shape. The shape and the position of the trench 310 correspond to the upper edge of the metallic shield layer 12 so that the bottom of the trench 310 is connected to the entire upper edge of the metallic shield layer 12. As the result, the shielding layer cover 321 in the trench 310 can be entirely connected to the upper edge of the metallic shield layer 12 to form a complete metallic shielding mask, enclosing the chip component 20 disposed in the composite inner layer circuit structure 10 and achieving the superior shielding effect when the shielding layer cover 321 is connected to the grounding terminal 33.

Figure 5A:
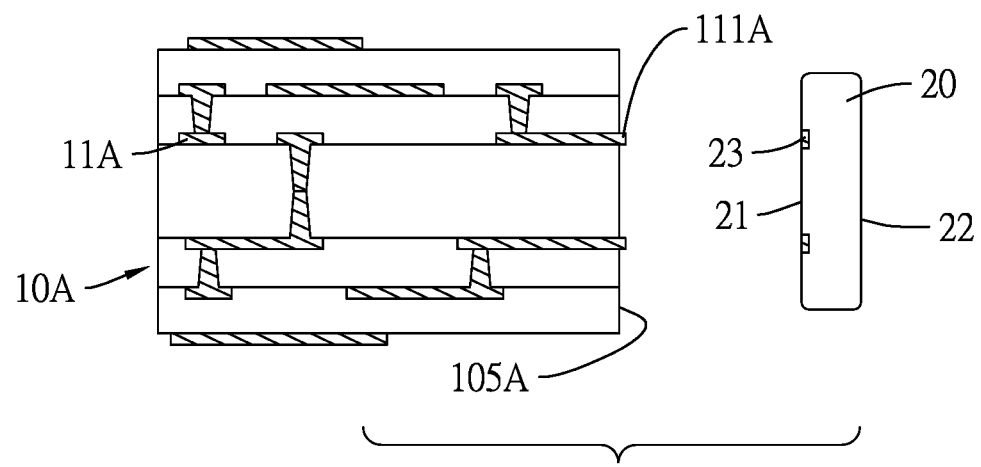
FIG. 5A to FIG. 5F are the profile diagrams of the manufacture method for the substrate with a buried component in the third embodiment of the present invention.
Figure 5B:
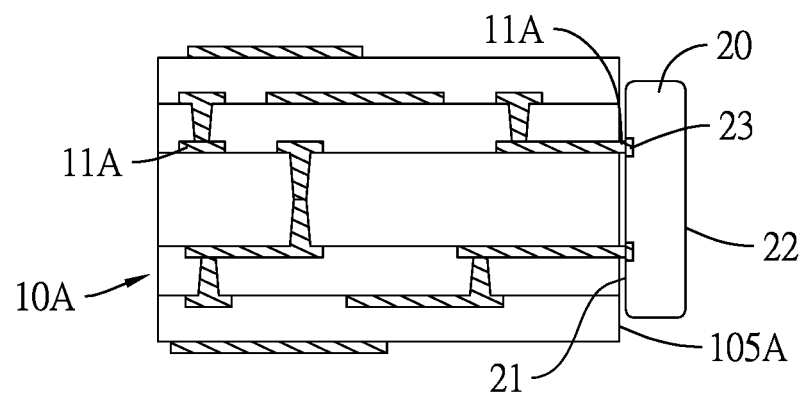
Figure 5C:
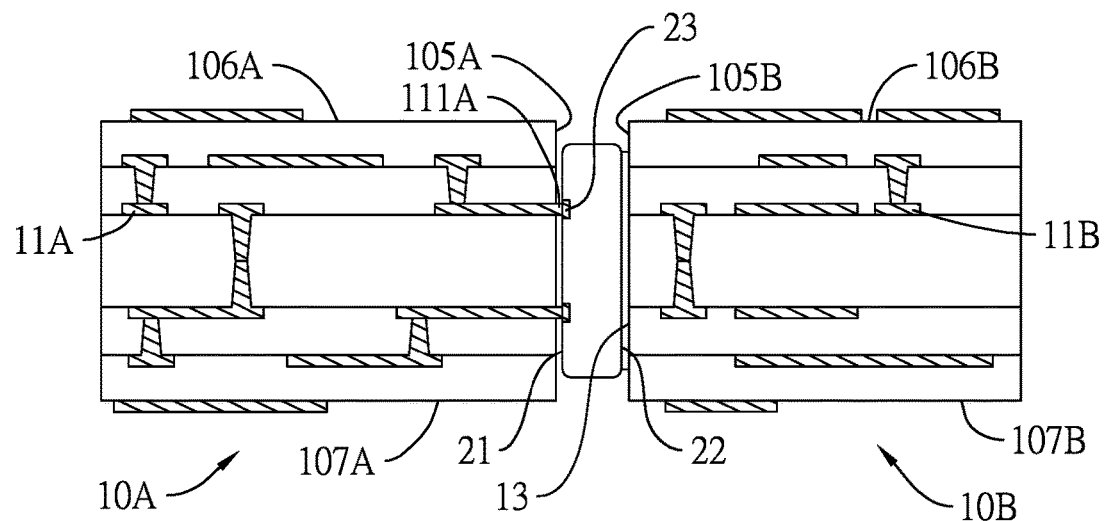

Refer to FIG. 5A to FIG. 5C. In a third embodiment, the present invention provides another method for manufacturing the substrate with a buried component, including the following steps:

- as shown in FIG. 5A, providing a first composite inner layer circuit structure 10A; wherein the first composite inner layer circuit structure 10A includes a plurality of first circuit layers 11A and has a first side 105A; wherein at least two component connecting ends 111A of at least two first circuit layers 11A in the plurality of first circuit layers 11A protrude from the first side 105A;
- providing a chip component 20; wherein the chip component 20 has a bottom surface 21 and a top surface 22 opposite to the bottom surface 21, and has at least one surface bonding pad 23 on the bottom surface 21;
- as shown in FIG. 5B, facing the bottom surface 21 of the chip component 20 to the first side 105A of the first composite inner layer circuit structure 10A;
- connecting the at least two surface bonding pads 23 to at least two component connecting ends 111A of the first composite inner layer circuit structure 10A; preferably, wherein the surface bonding pad 23 of the chip component 20 and the component connecting end 111A of the first circuit layer 11A are bonded by the method of heat diffusion welding or the method of ultrasonic welding;
- as shown in FIG. 5C, providing a second composite inner layer circuit structure 10B; wherein the second composite inner layer circuit structure 10B includes a plurality of second circuit layers 11B, and has a second side 105B; wherein the second side 105B of the second composite inner layer circuit structure 10B is bonded to the top surface 22 of the chip component 20; preferably, wherein the second side 105B of the second composite inner layer circuit structure 10B is bonded to the top surface 22 of the chip component 20 by an adhesion layer 13.

Figure 5D:
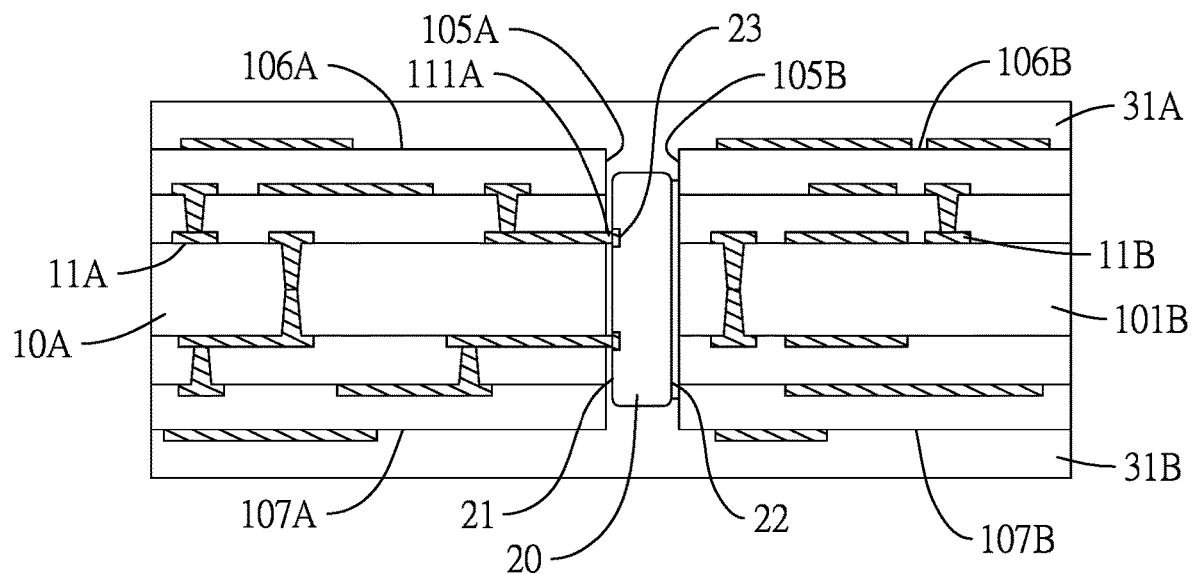
Figure 5E:
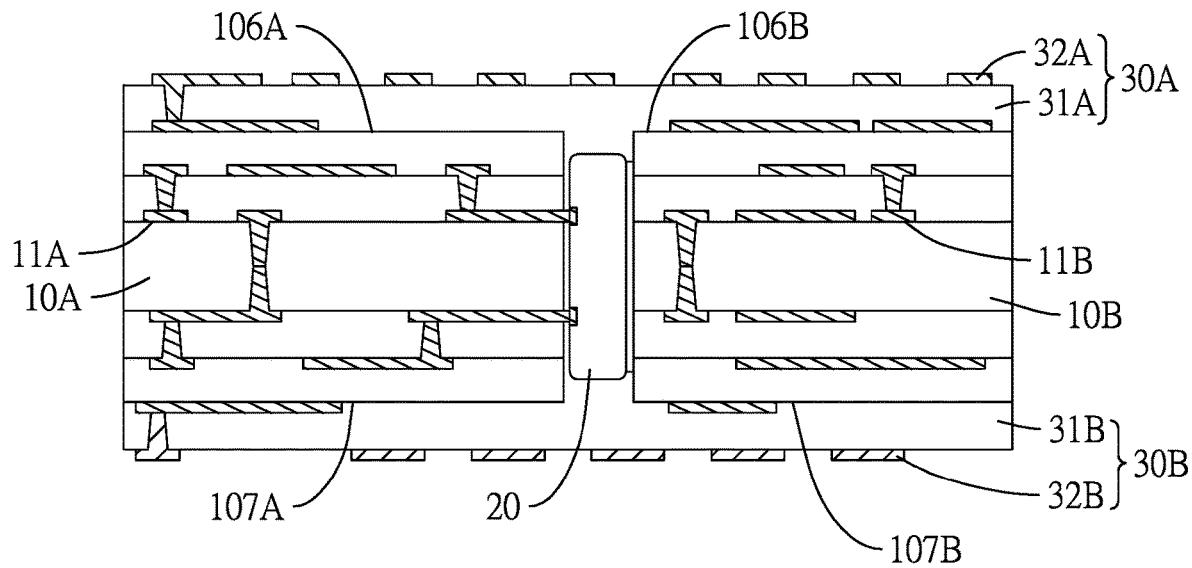
Figure 5F:
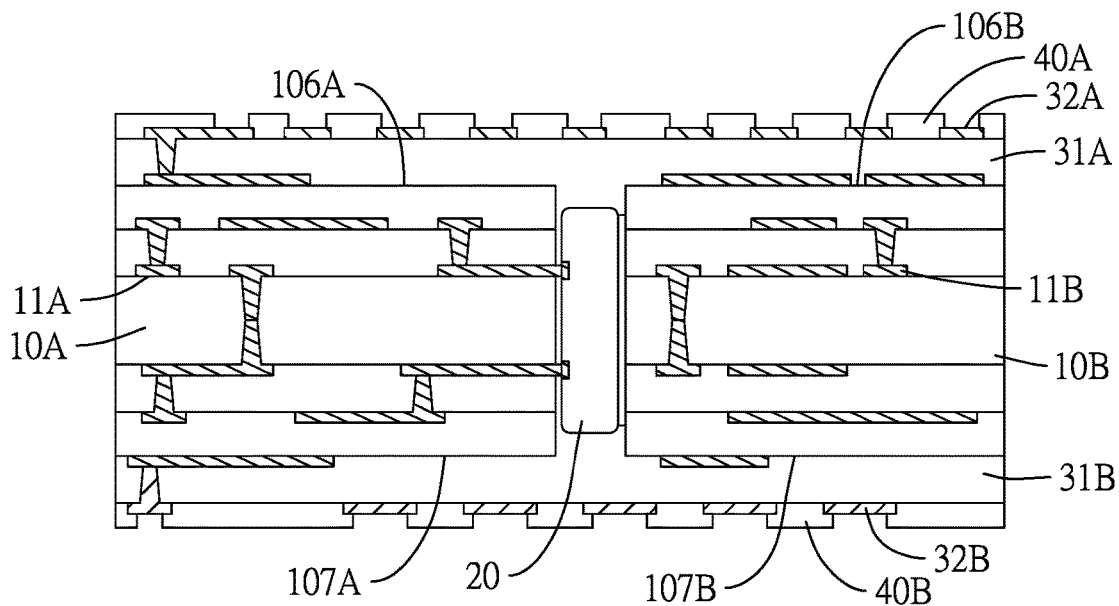

Refer to FIG. 5D to FIG. 5F. The method further performs a circuit build-up layer process to respectively dispose two adding layer circuit structures 30A, 30B on and below the first composite inner layer circuit structure 10A and the second composite inner layer circuit structure 10B. Therefore, the first composite inner layer circuit structure 10A, the chip component 20 and the second composite inner layer circuit structure 10B are fixed between the two adding layer circuit structures 30A, 30B.

As mentioned above, the first composite inner layer circuit structure 10A has a first top surface 106A and a first bottom surface 107A opposite to the first top surface 106A. The second composite inner layer circuit structure 10B has a second top surface 106B and a second bottom surface 107B opposite to the second top surface 106B. The first top surface 106A and the second top surface 106B are parallel to the same direction, and the first bottom surface 107A and the second bottom surface 107B are parallel to the same direction. Moreover, the circuit build-up layer process includes the following steps:

- as shown in FIG. 5D, covering a first adding dielectric layer 31A on the first top surface 106A of the first composite inner layer circuit structure 10A and the second top surface 106B of the second composite inner layer circuit structure 10B;
- covering a second adding dielectric layer 31B on the first bottom surface 107A of the first composite inner layer circuit structure 10A and the second bottom surface 107B of the second composite inner layer circuit structure 10B;
- as shown in FIG. 5E, disposing a first adding circuit layer 32A on the first adding dielectric layer 31A and disposing a second adding circuit layer 32B on the second adding dielectric layer 31.

Preferably, referring to FIG. 5F, after the method disposes the first adding circuit layer 32A and second adding circuit layer 32B, the method further respectively disposes the first solder mask layer 40A and the second solder mask layer 40B on the first adding circuit layer 32A and the second adding circuit layer 32B to complete the substrate with a buried component.

In the third embodiment, the method utilizes two composite inner layer circuit structures with the chip component to form the substrate with a buried component of the present invention. The first circuit layer 11A of the first composite inner layer circuit structure 10A protrudes from the component connecting end 111A of the first side 105A to be connected to the surface bonding pad 23 disposed at the bottom surface 21 of the chip component 200. After the chip component 20 is connected to the first composite inner layer circuit structure 10A, the second side 105B of the second composite inner layer circuit structure 10B is bonded to the top surface 22 of the chip component 20 far away the first composite inner layer circuit structure 10A to form an assembly composite inner layer circuit structure clamping the chip component 20. After that, the adding layer circuit structure 30A and the adding layer circuit structure 30B are respectively disposed on the top surface and the bottom surface of the assembly composite inner layer circuit structure in the circuit build-up layer process to fix the first composite inner layer circuit structure 10A, the second composite inner layer circuit structure 10B and the chip 24 component 20. The first composite inner layer circuit structure 10A can be electrically connected to the second composite inner layer circuit structure 10B via the first adding circuit layer 31A and the second adding circuit layer 31B in the adding layer circuit structure 30A, 30B.

Figure 6:
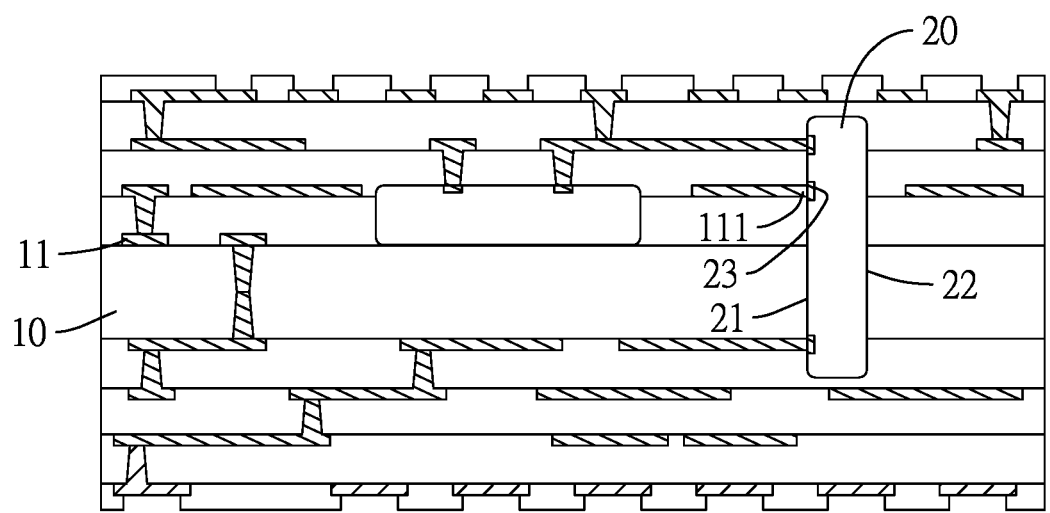
FIG. 6 is another side view profile diagram of the substrate with a buried component of the present invention.
Figure 7:
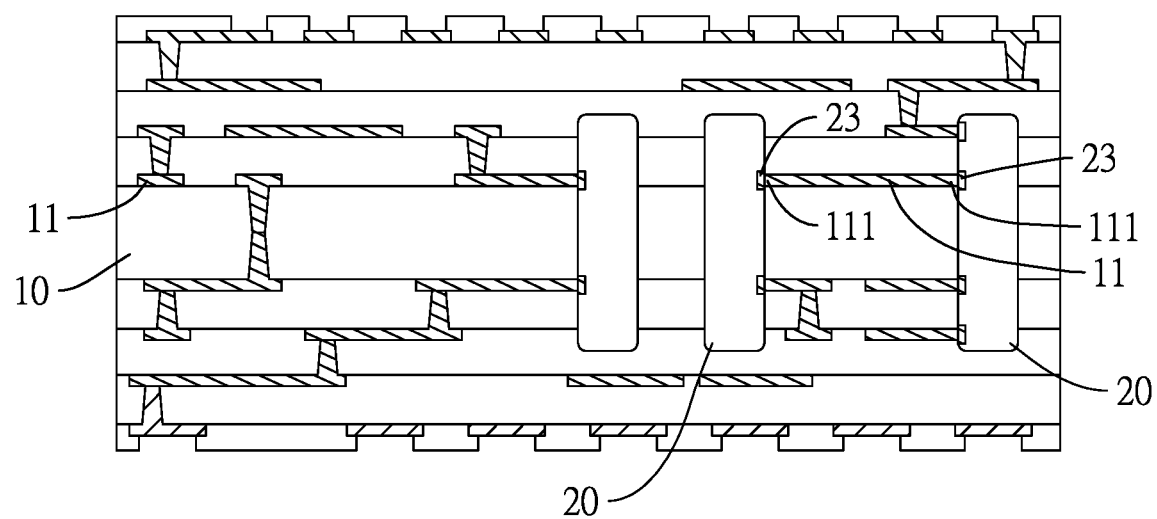
FIG. 7 is another side view profile diagram of the substrate with a buried component of the present invention.
Figure 8:
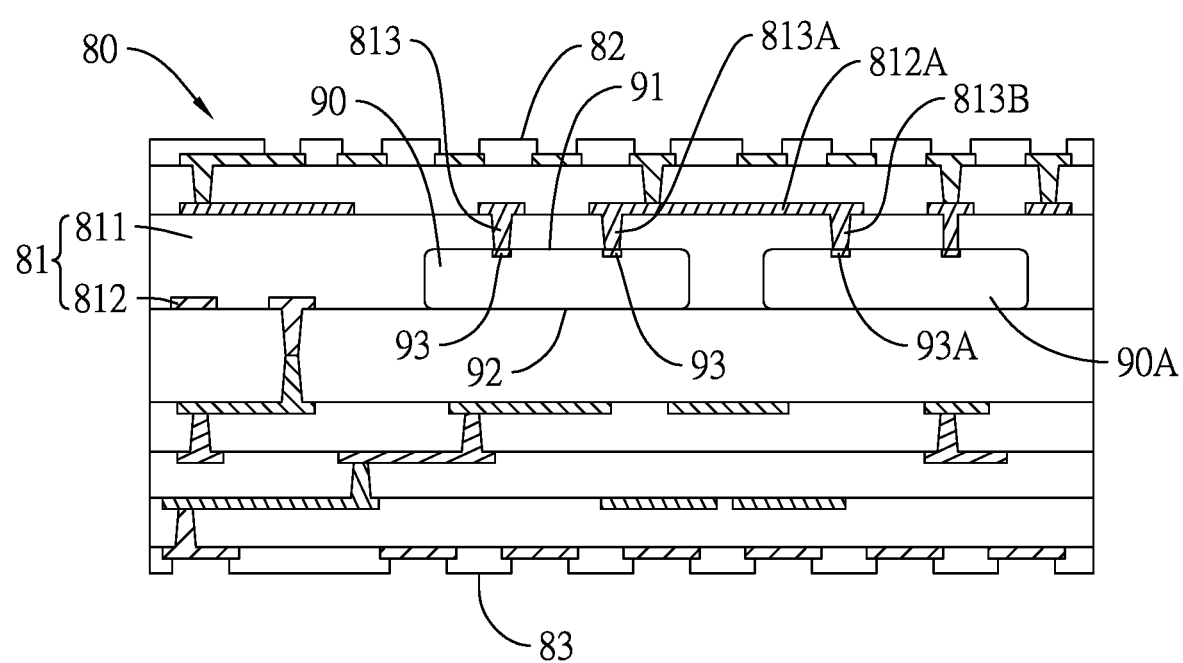
FIG. 8 is a side view profile diagram of the substrate with a buried component of the prior art.

As shown in FIG. 6, both the substrate with a buried component of the present invention allows the chip component 20 to occupy less horizontal areas of the circuit layer 11 and the surface bonding pad of the chip component 20 is directly connected to the component connecting end 111 of the circuit layer 11. Consequently, the chip component 20 does not have to be perpendicularly connected to the conductive blind hole and the circuit layer 11 via the circuit layer 11. In addition, as shown in FIG. 7, when the substrate with a buried component of the present invention disposes at least two chip components 20, the two chip components 20 can be connected to each other via the component connecting end 111 at the two terminals of the circuit layer 11 to reduce the connection path. In contrast, the two chip components of the prior art are connected to each other via the conductive blind hole, the circuit layer, and the conductive blind hole.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A substrate with a buried component, comprising:
   a composite inner layer circuit structure, including a plurality of circuit layers, and having at least one component connecting end; and
   a chip component, disposed in the composite inner layer circuit structure, penetrating at least two circuit layers of the plurality of circuit layers, having a top surface and a bottom surface opposite to the top surface, and having at least one surface bonding pad at the bottom surface; wherein the at least one surface bonding pad of the chip component is connected to the at least one component connecting end of the plurality of circuit layers;
   wherein the composite inner layer circuit structure has a chip containing groove, formed through at least two circuit layers of the plurality of circuit layers and having a mounting side wall; wherein the at least one component connecting end protrudes from the mounting side wall in the chip containing groove;
   wherein the chip component is disposed in the chip containing groove, the bottom surface of the chip component faces to the mounting side wall in the chip containing groove, and the surface bonding pad is connected to the at least one component connecting end of the at least two circuit layers.

2. The substrate with a buried component as claimed in claim 1, further comprising:
   an adding layer circuit structure, stacked with the composite inner layer circuit structure and closing an opening of the chip containing groove.

3. The substrate with a buried component as claimed in claim 2, wherein a bottom wall and a lateral wall are disposed in the chip containing groove and the mounting side wall is a part of the lateral wall; wherein the substrate with a buried component further comprises:
   a metallic shield layer, covering the bottom wall of the chip containing groove and a part of the lateral wall excluding the mounting side wall, connected to the surface circuit structure, and electrically connected to a grounding terminal via the surface circuit structure.

* * * * *